(12) United States Patent  
Rofougaran

(10) Patent No.: US 7,826,550 B2  
(45) Date of Patent: Nov. 2, 2010

(54) METHOD AND SYSTEM FOR A HIGH-PRECISION FREQUENCY GENERATOR USING A DIRECT DIGITAL FREQUENCY SYNTHESIZER FOR TRANSMITTERS AND RECEIVERS

(75) Inventor: Ahmadreza Rofougaran, Newport Coast, CA (US)

(73) Assignee: Broadcom Corp., Irvine, CA (US)

( * ) Notice: Subject to any disclaimer, the term of this patent is extended or adjusted under 35 U.S.C. 154(b) by 796 days.

(21) Appl. No.: 11/680,370

(22) Filed: Feb. 28, 2007

(65) Prior Publication Data

US 2008/0205543 A1    Aug. 28, 2008

(51) Int. Cl.  
    *H03K 7/06*      (2006.01)  
    *H03K 9/06*      (2006.01)

(52) U.S. Cl. .................. 375/271; 375/135; 375/376; 375/320; 330/149; 332/159

(58) Field of Classification Search ............... 375/135, 375/271, 376, 320; 330/149; 332/159  
See application file for complete search history.

(56) References Cited

U.S. PATENT DOCUMENTS

| | | | | |
|---|---|---|---|---|
| 5,184,093 | A * | 2/1993 | Itoh et al. | 331/25 |
| 5,710,517 | A * | 1/1998 | Meyer | 327/163 |
| 5,742,208 | A * | 4/1998 | Blazo | 331/23 |
| 5,801,589 | A * | 9/1998 | Tajima et al. | 331/1 R |
| 5,834,985 | A * | 11/1998 | Sundegård | 332/100 |
| 6,392,494 | B2 * | 5/2002 | Takeyabu et al. | 331/11 |
| 6,404,293 | B1 * | 6/2002 | Darabi et al. | 331/37 |
| 6,429,693 | B1 * | 8/2002 | Staszewski et al. | 327/12 |
| 6,483,388 | B2 * | 11/2002 | Khan | 331/18 |
| 6,738,601 | B1 * | 5/2004 | Rofougaran et al. | 455/66.1 |
| 6,744,839 | B1 * | 6/2004 | Tada et al. | 375/376 |
| 6,924,711 | B2 * | 8/2005 | Liu | 332/159 |
| 6,950,957 | B1 * | 9/2005 | O'Leary | 713/401 |
| 7,006,589 | B2 * | 2/2006 | Staszewski et al. | 375/371 |
| 7,142,063 | B2 * | 11/2006 | Grewing et al. | 331/16 |
| 7,203,262 | B2 * | 4/2007 | Moy et al. | 375/376 |
| 7,224,302 | B2 * | 5/2007 | Dornbusch | 341/143 |
| 7,233,629 | B2 * | 6/2007 | Auranen | 375/316 |
| 7,289,005 | B2 * | 10/2007 | Puma | 332/145 |
| 7,366,481 | B2 * | 4/2008 | Okada et al. | 455/126 |
| 7,394,418 | B2 * | 7/2008 | Eikenbroek | 341/143 |
| 7,397,868 | B2 * | 7/2008 | Shi et al. | 375/316 |
| 7,432,770 | B2 * | 10/2008 | Shigemori et al. | 331/77 |

(Continued)

*Primary Examiner*—Chieh M Fan  
*Assistant Examiner*—Santiago Garcia  
(74) *Attorney, Agent, or Firm*—McAndrews, Held & Malloy, Ltd.

(57) ABSTRACT

Aspects of a method and system for a high-precision frequency generator using a direct digital frequency synthesizer for transmitters and receivers may include generating a second signal from a first signal by frequency translating an inphase component of the first signal utilizing a high-precision oscillating signal that may be generated using at least a direct digital frequency synthesizer (DDFS) and at least a Phase-Locked Loop (PLL). A corresponding quadrature component of the first signal may be frequency translated utilizing a phase-shifted version of the high-precision oscillating signal. The inphase component of the first signal may be multiplied with the high-precision oscillating signal and the quadrature component of the first signal may be multiplied with the phase-shifted version of the high-precision oscillating signal. The second signal may be generated from the first signal by adding the frequency translated inphase component to the frequency translated quadrature component.

16 Claims, 6 Drawing Sheets

U.S. PATENT DOCUMENTS

| | | | | |
|---|---|---|---|---|
| 7,436,920 B2* | 10/2008 | Shachar et al. | | 375/376 |
| 7,466,195 B2* | 12/2008 | Drogi et al. | | 330/136 |
| 7,480,344 B2* | 1/2009 | Zolfaghari et al. | | 375/297 |
| 7,526,055 B2* | 4/2009 | Lee | | 375/376 |
| 7,528,638 B2* | 5/2009 | Lee et al. | | 327/158 |
| 7,532,989 B1* | 5/2009 | Torosyan | | 702/66 |
| 7,535,311 B2* | 5/2009 | Nergis | | 332/127 |
| 7,593,698 B1* | 9/2009 | Johnson et al. | | 455/102 |
| 7,599,418 B2* | 10/2009 | Ahmed | | 375/135 |
| 2002/0055337 A1* | 5/2002 | Persico et al. | | 455/112 |
| 2002/0150169 A1* | 10/2002 | Kishi | | 375/295 |
| 2002/0159555 A1* | 10/2002 | Staszewski et al. | | 375/376 |
| 2003/0001681 A1* | 1/2003 | Asikainen et al. | | 331/18 |
| 2003/0141932 A1* | 7/2003 | Toyota et al. | | 330/285 |
| 2004/0097210 A1* | 5/2004 | Sato | | 455/260 |
| 2004/0136441 A1* | 7/2004 | Ryu et al. | | 375/135 |
| 2006/0270346 A1* | 11/2006 | Ibrahim et al. | | 455/41.2 |
| 2007/0286322 A1* | 12/2007 | Uchino et al. | | 375/376 |
| 2008/0132195 A1* | 6/2008 | Maxim et al. | | 455/334 |
| 2008/0204150 A1* | 8/2008 | Rofougaran | | 331/10 |
| 2008/0205542 A1* | 8/2008 | Rofougaran | | 375/271 |
| 2008/0205549 A1* | 8/2008 | Rofougaran | | 375/299 |
| 2008/0205550 A1* | 8/2008 | Rofougaran | | 375/302 |
| 2008/0205560 A1* | 8/2008 | Rofougaran | | 375/344 |
| 2009/0086795 A1* | 4/2009 | Rofougaran et al. | | 375/216 |
| 2009/0086796 A1* | 4/2009 | Rofougaran | | 375/219 |
| 2009/0086844 A1* | 4/2009 | Rofougaran | | 375/295 |
| 2009/0086851 A1* | 4/2009 | Rofougaran | | 375/324 |
| 2009/0248929 A1* | 10/2009 | Rofougaran | | 710/106 |
| 2009/0258706 A1* | 10/2009 | Rofougaran et al. | | 463/39 |

* cited by examiner

METHOD AND SYSTEM FOR A HIGH-PRECISION FREQUENCY GENERATOR USING A DIRECT DIGITAL FREQUENCY SYNTHESIZER FOR TRANSMITTERS AND RECEIVERS

CROSS-REFERENCE TO RELATED APPLICATIONS/INCORPORATION BY REFERENCE

This application makes reference to:
U.S. application Ser. No. 11/680,044, filed on even date herewith;
U.S. application Ser. No. 11/680,236, filed on even date herewith;
U.S. application Ser. No. 11/680,165, filed on even date herewith;
U.S. application Ser. No. 11/680,176, filed on even date herewith;
U.S. application Ser. No. 11/680,188, filed on even date herewith; and
U.S. application Ser. No. 11/680,253, filed on even date herewith.

Each of the above referenced applications is hereby incorporated herein by reference in its entirety.

FIELD OF THE INVENTION

Certain embodiments of the invention relate to signal processing for communication systems. More specifically, certain embodiments of the invention relate to a method and system for a high-precision frequency generator using a direct digital frequency synthesizer for transmitters and receivers.

BACKGROUND OF THE INVENTION

A Direct Digital Frequency Synthesizer (DDFS) is a digitally-controlled signal generator that may vary the output signal frequency over a large range of frequencies, based on a single fixed-frequency precision reference clock. In addition, a DDFS is also phase-tunable. In essence, within the DDFS, discrete amplitude levels are fed to a Digital-to-Analog Converter (DAC) at a sampling rate determined by the fixed-frequency reference clock. The output of the DDFS provides a signal whose shape depends on the sequence of discrete amplitude levels that are fed to the DAC at the constant sampling rate. The DDFS is particularly well suited as a frequency generator that outputs a sine or other periodic waveforms over a large range of frequencies, from almost DC to approximately half the fixed-frequency reference clock frequency.

A DDFS offers a larger range of operating frequencies and requires no feedback loop, thereby providing near instantaneous phase—and frequency changes, avoiding over—and undershooting and settling time issues associated with another analog systems. A DDFS may provide precise digitally-controlled frequency and/or phase changes without signal discontinuities.

In some communication systems, inphase and quadrature channels are modulated onto a carrier frequency that may be generated and controlled in an analog Phase-Locked Loop comprising a phase detector, a loop filter, an amplifier and a voltage controlled oscillator in a feedback-loop configuration. These analog PLLs are limited to operations that may offer a discrete set of frequencies determined by the frequency of the PLL reference clock and, possibly, a divider. Furthermore, because of the feedback-loop configuration, any change in frequency may require the analog PLL to transition to a new steady-state.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for a high-precision frequency generator using a direct digital frequency synthesizer for transmitters and receivers, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a high-precision frequency generator using a direct digital frequency synthesizer for transmitters and receivers. Aspects of the method and system may include generating a second signal from a first signal by frequency translating an inphase component of the first signal utilizing a high-precision oscillating signal that may be generated using at least a direct digital frequency synthesizer (DDFS) and at least a Phase-Locked Loop (PLL). A corresponding quadrature component of the first signal may be frequency translated utilizing a phase-shifted version of the high-precision oscillating signal. The inphase component of the first signal may be multiplied with the high-precision oscillating signal and the quadrature component of the first signal may be multiplied with the phase-shifted version of the high-precision oscillating signal.

The second signal may be generated from the first signal by adding the frequency translated inphase component to the frequency translated quadrature component. The Phase-Locked Loop (PLL) that may be communicatively coupled to and controlled by at least the DDFS may generate the high-precision oscillating signal. The PLL may comprise at least a fixed-factor frequency divider. A fixed-frequency reference oscillating signal or the high-precision oscillating signal may be used to clock the DDFS. In instances when the high-precision oscillating signal may be used to clock the DDFS, a clock compensation signal may be generated in a frequency control block from a frequency divided version of the high-precision oscillating signal.

Figure 1A:
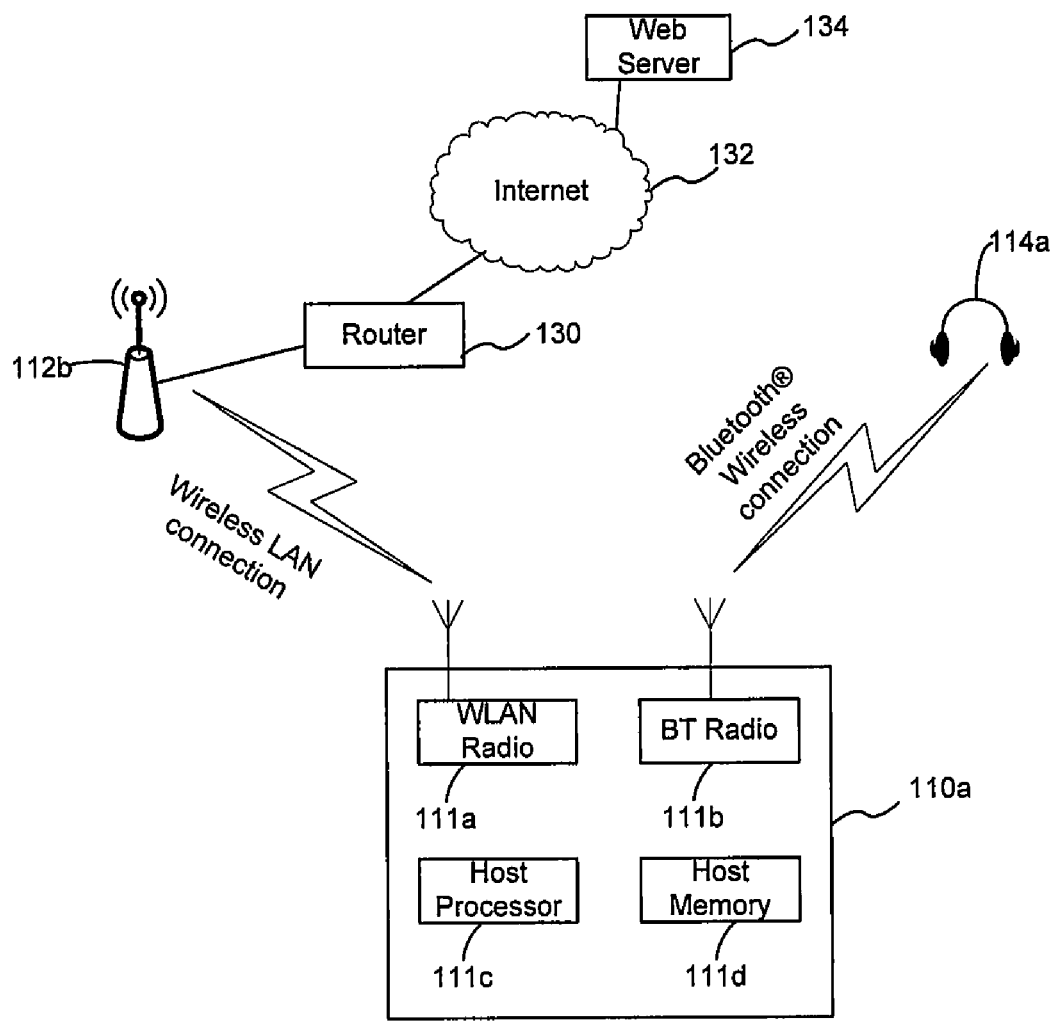
FIG. 1A is a diagram illustrating an exemplary WLAN and Bluetooth® wireless communication system, in connection with an embodiment of the invention.

FIG. 1A is a diagram illustrating an exemplary WLAN and Bluetooth® wireless communication system, in connection with an embodiment of the invention. Referring to FIG. 1, there is shown a WLAN access point 112b, a computer 110a, a Bluetooth® headset 114a, a router 130, the Internet 132 and a web server 134. The computer or host device 110a may comprise a wireless LAN (WLAN) radio 111a, a Bluetooth® radio 111b, a host processor 111c, and a host memory 111d. There is also shown a Wireless LAN (WLAN) connection between the wireless LAN radio 111a and the wireless LAN access point 112b, and a Bluetooth® wireless connection between the Bluetooth® radio 111b and the Bluetooth® headset 114a.

Frequently, computing and communication devices may comprise hardware and software to communicate using multiple wireless communication standards. The WLAN radio 111a may be compliant with IEEE 802.11 standard. There may be instances when the WLAN radio 111a and the Bluetooth® radio 111b are active concurrently. For example, it may be desirable for a user of the computer or host device 110a to access the Internet 132 in order to consume streaming content from the Web server 134. Accordingly, the user may establish a WLAN connection between the computer 110a and the access point 112b. Once this connection is established, the streaming content from the Web server 134 may be received via the router 130, the access point 112b, and the WLAN connection, and consumed by the computer or host device 110a.

It may be further desirable for the user of the computer 110a to listen to an audio portion of the streaming content on the Bluetooth® headset 114a. Accordingly, the user of the computer 110a may establish a Bluetooth® wireless connection with the Bluetooth® headset 114a. Once the Bluetooth® wireless connection is established, and with suitable configurations on the computer enabled, the audio portion of the streaming content may be consumed by the Bluetooth® headset 114a. In instances where such advanced communication systems are comprised in the host device 110a, the RF frequency generation may support high-precision frequency switching to enable support of multiple communication standards and/or advanced wideband systems.

Figure 1B:
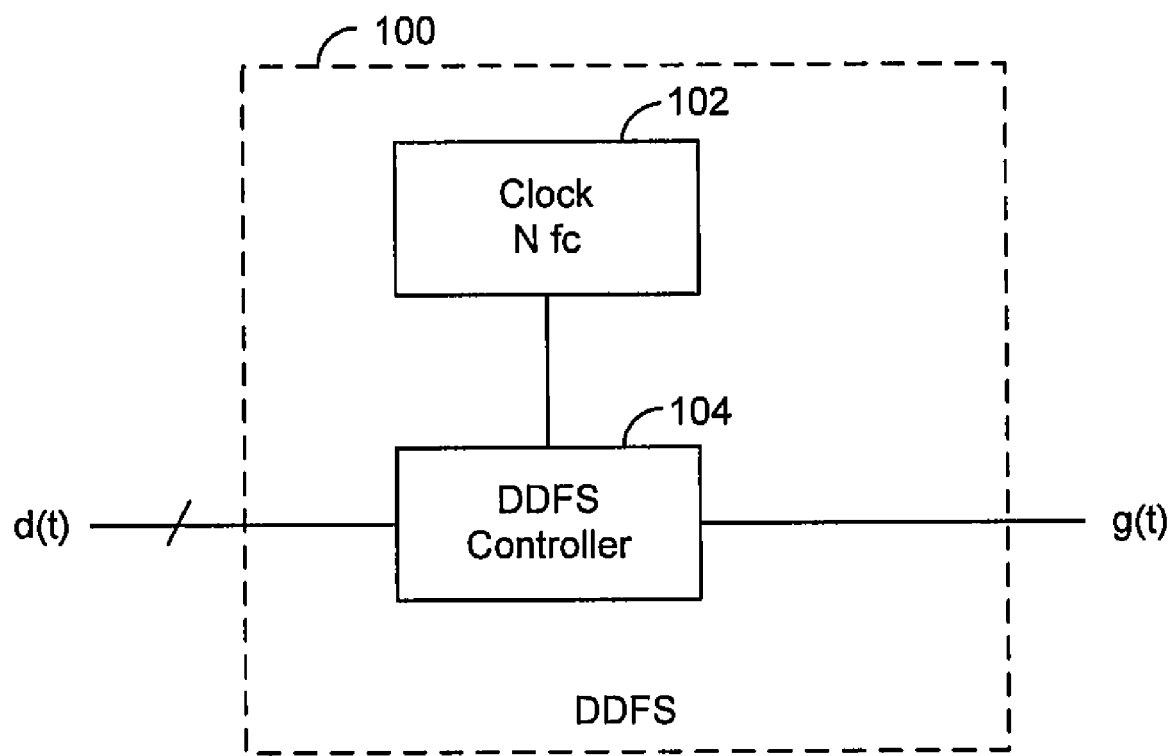
FIG. 1B is a block diagram illustrating an exemplary Direct Digital Frequency Synthesizer (DDFS), in connection with an embodiment of the invention.

FIG. 1B is a block diagram illustrating an exemplary Direct Digital Frequency Synthesizer (DDFS), in connection with an embodiment of the invention. Referring to FIG. 1B, there is shown a DDFS 100, a clock 102 and a DDFS controller 104. There is also shown a digital input signal d(t) and an analog output signal g(t).

The DDFS 100 may be a digitally-controlled signal generator that may vary the analog output signal g(t) over a large range of frequencies, based on a single fixed-frequency precision reference clock, which may be clock 102. In addition, the DDFS 100 is also phase-tunable. The digital input signal d(t) may comprise control information about the frequency and/or phase of the analog output signal g(t) that may be generated as a function of the digital input signal d(t). The clock 102 may provide a reference clock that may be N times higher than the frequency fc that may be generated at the output signal g(t). Using the clock 102 and the information that may be contained in the digital input signal d(t), the DDFS controller 104 may generate a variable frequency analog output signal g(t).

Figure 2:
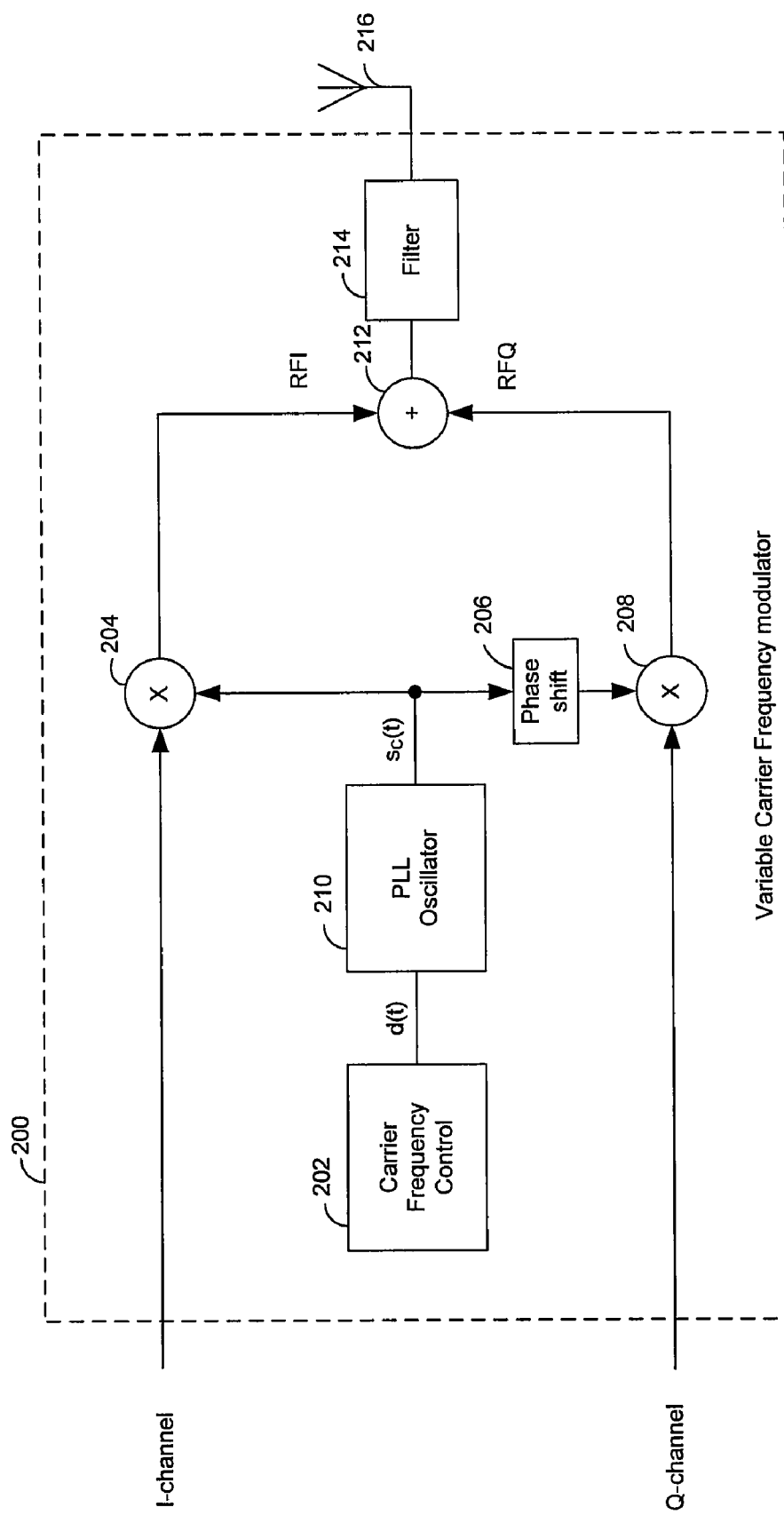
FIG. 2 is block diagram illustrating an exemplary embodiment of a variable carrier frequency modulator for an inphase and quadrature channel, in accordance with an embodiment of the invention.

FIG. 2 is block diagram illustrating an exemplary embodiment of a variable carrier frequency modulator for an inphase and quadrature channel, in accordance with an embodiment of the invention. Referring to FIG. 2, there is shown a variable carrier frequency modulator 200 that may be coupled to an antenna 216. The variable carrier frequency modulator 200 may comprise a carrier frequency control 202, a Phase-Locked Loop (PLL) oscillator 210, multipliers 204 and 208, a phase shift block 206, a summation block 212, and a filter 214. There is also shown an inphase (I) channel signal, a quadrature (Q) channel signal, a PLL control signal d(t), a carrier frequency signal $f_C(t)$, a modulated I-channel signal RFI, and a modulated Q-channel signal RFQ.

In some communication systems, the I-channel and the Q-channel may be modulated onto the carrier frequency separately and may be added after modulation and before transmission. The I-channel signal may be modulated onto the carrier frequency signal $s_C(t)$ by multiplying the I-channel signal with the carrier frequency signal $s_C(t)$ in the multiplier 204. The output signal of multiplier 204 may be the modulated I-channel signal RFI. The Q-channel signal may be modulated onto a phase-shifted carrier frequency signal by multiplying the Q-channel signal with the phase-shifted carrier frequency signal in the multiplier 208. The phase-shifted carrier frequency may be obtained by shifting the phase of the carrier frequency signal $s_C(t)$ in phase shift block 206. The phase shift block 206 may, for example, shift the phase of the carrier frequency signal by 90 degrees. The output signal of the multiplier 208 may be the modulated Q-channel signal RFQ. The PLL oscillator 210 may be controlled by the carrier frequency control 202 via the PLL control signal d(t). In some transmission systems, the carrier frequency signal $s_C(t)$ may change quickly; for example in Orthogonal Frequency Division Multiplexing (OFDM) systems. In other systems, the carrier frequency control 202 may select one of a few, rarely changing transmission channels.

Figure 3:
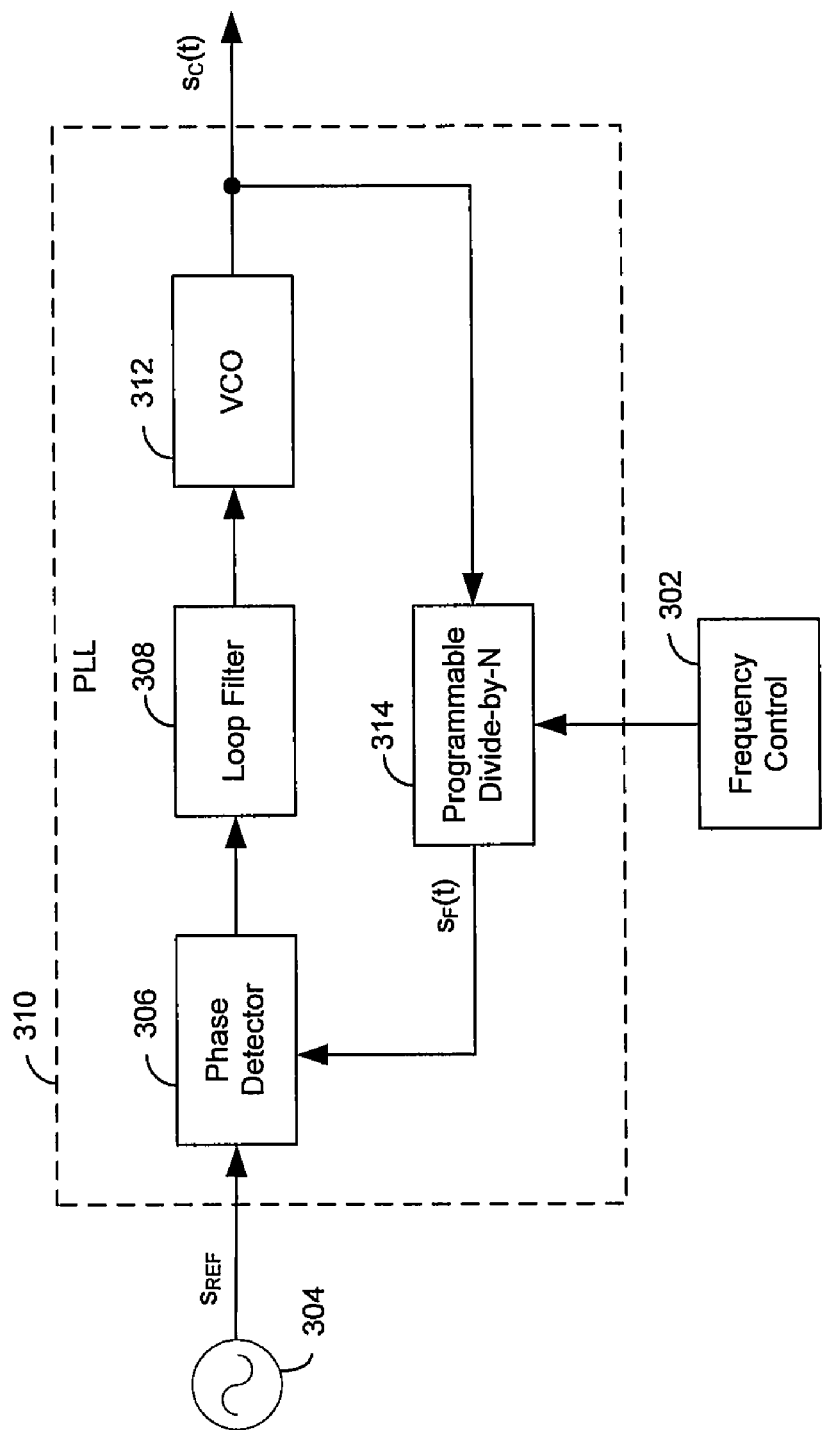
FIG. 3 is a block diagram illustrating an exemplary architecture of a frequency synthesizer using a Phase-Locked Loop (PLL), in connection with an embodiment of the invention.

FIG. 3 is a block diagram illustrating an exemplary architecture of a frequency synthesizer using a Phase-Locked Loop (PLL), in connection with an embodiment of the invention. Referring to FIG. 3, there is shown a PLL 310, a reference oscillator 304 and a frequency control block 302. The PLL 310 may comprise a phase detector 306, a loop filter 308, a voltage-controlled oscillator (VCO) 312 and a programmable divider 314. There is also shown a reference frequency signal $S_{REF}$, a feedback signal $S_F(t)$ and an output signal $s_C(t)$.

The PLL 310 may comprise suitable logic circuitry and/or code that may enable generation of an output signal $s_C(t)$ with frequency $f_C(t)=N(t)f_{REF}$ that may be phase-synchronized with the input signal $S_{REF}$. The frequency $f_{REF}$ may be the frequency of the reference frequency signal $S_{REF}$ and N(t) may be a division factor that may vary with time. The factor N(t) may be an integer and may be adjusted in the programmable divider 314 by the frequency control block 302. By varying the division factor N(t) in the programmable divider 314, the output signal $s_C(t)$ may oscillate at different frequencies that may be integer multiples of the frequency of the input signal $S_{REF}$. The frequency $f_{REF}$ may be constant over time. In order to enable high signal quality, the reference oscillator 304 may be, for example, a calibrated and temperature-compensated crystal oscillator.

The phase detector 306 may comprise suitable logic, circuitry and/or code that may be enabled to compare the frequency $f_{REF}$ with the frequency $f_F(t)$ and generate an output signal that may be proportional to the difference in phase and frequency between the input signals $S_{REF}$ and $S_F(t)$. This phase-difference signal may be fed to a loop filter 308. The loop filter 308 may attenuate frequency components far from the center frequency and its operation may determine the transient characteristics of the feedback loop as well as the frequency range over with the PLL 310 may be able to operate. The output signal of the loop filter 308 may drive the VCO 312 that may adjust its output frequency $f_C(t)$ of the output signal $s_C(t)$ as a function of its input voltage. The signal $s_C(t)$ may be fed back to a programmable divider 314 that may divide the frequency of its input signal $s_C(t)$ by a factor N(t) to generate a feedback signal $s_F(t)$ with frequency $f_F(t)$. The factor N(t) may, for example, vary from 1-100 and hence the resulting output frequency $f_C(t)$ may be much faster than the reference frequency $f_{REF}$. One disadvantage may be that the output frequency $f_C(t)$ may be changed in relatively large frequency steps that may be determined by N(t) and the frequency $f_{REF}$. Another disadvantage may be the complexity associated with a programmable divider 314 and the need to calibrate and compensate the reference oscillator 304.

Figure 4:
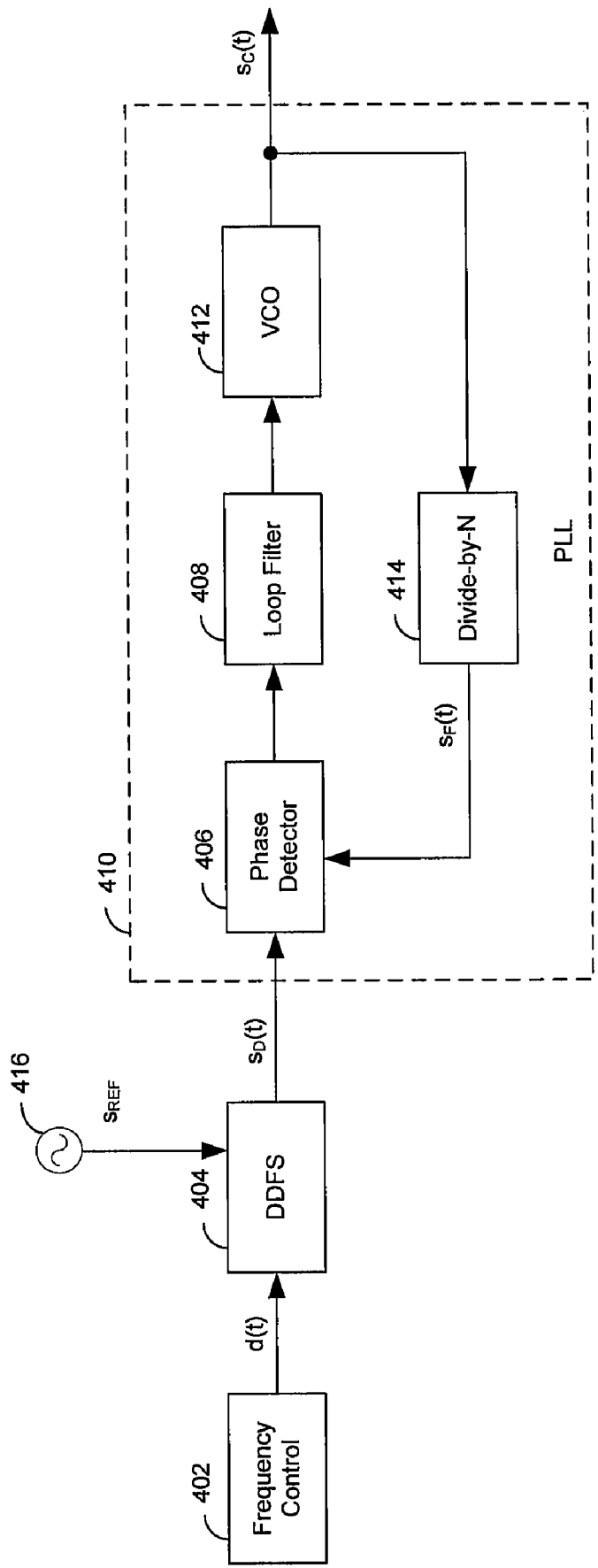
FIG. 4 is a block diagram illustrating an exemplary PLL architecture utilizing a DDFS, in accordance with an embodiment of the invention.

FIG. 4 is a block diagram illustrating an exemplary PLL architecture utilizing a DDFS, in accordance with an embodiment of the invention. Referring to FIG. 4, there is shown a frequency control 402, a DDFS 404, a reference oscillator 416 and a PLL 410. The PLL 410 may comprise a phase detector 406, a loop filter 408, a VCO 412 and a divider 414. There is also shown a DDFS control signal d(t), a reference frequency signal $S_{REF}$, a DDFS output signal $s_D(t)$, a feedback signal $s_F(t)$, and an output signal $s_C(t)$.

The PLL 410 shown in FIG. 4 may be similar to the PLL 310 shown in FIG. 3, in particular the phase detector 406, the loop filter 408 and the VCO 412 may function similarly to the phase detector 306, the loop filter 308 and the VCO 312. The divider 414 may not be programmable and frequency-divide the fed back output signal $s_C(t)$ by a fixed factor N. This may be advantageous because the implementation of the divider 414 may be simpler than the implementation of the programmable divider 314. For the PLL 410, the output signal $s_C(t)$ and its frequency $f_C(t)$ may be adjusted by varying the input signal to the PLL 410, the DDFS 404 output signal $s_D(t)$, while maintaining a constant factor N in the divider 414. The DDFS output signal $s_D(t)$ may be controlled by the frequency control 402 and the DDFS control signal d(t). The DDFS 404 may be clocked by a reference oscillator 416 that may comprise a high frequency $f_{REF}$.

Because the DDFS 404 may generate precise and small frequency changes, the embodiment in accordance with the invention illustrated in FIG. 4 may provide a almost continuously variable frequency output $s_C(t)$. Some implementations of the DDFS 404 may achieve sub-Hertz accuracy. Because the DDFS 404 may increment its output frequency $f_D(t)$ in small steps, it may not be necessary to use a programmable divider. Instead, a fixed divider 414 may by used. Since the DDFS 404 may be controlled digitally, calibration and compensation may be controlled easily from within the frequency control block 402.

Figure 5:
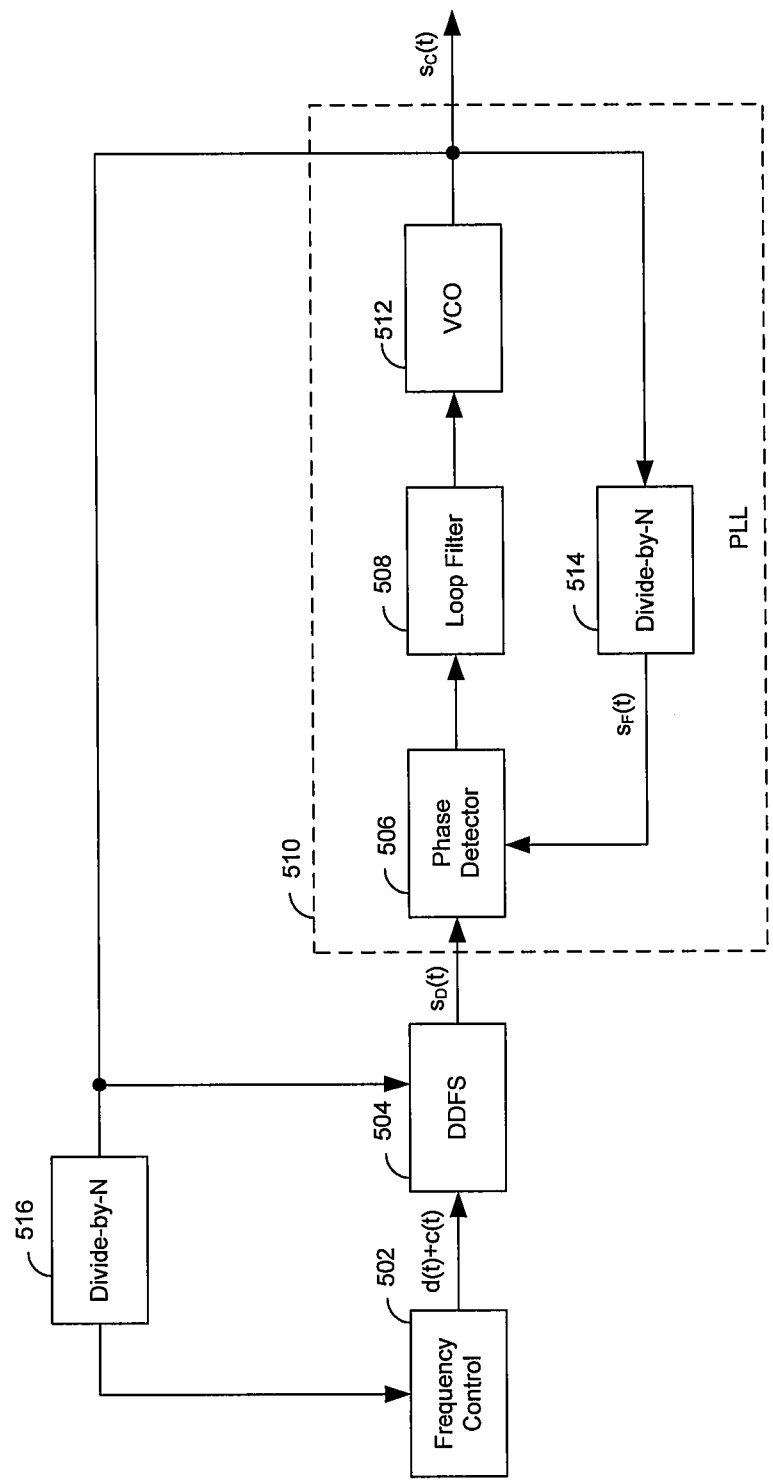
FIG. 5 is a block diagram illustrating an exemplary PLL architecture utilizing a DDFS and a VCO reference clock, in accordance with an embodiment of the invention.

FIG. 5 is a block diagram illustrating an exemplary PLL architecture utilizing a DDFS and a VCO reference clock, in accordance with an embodiment of the invention. Referring to FIG. 5, there is shown a frequency control 502, a DDFS 504, a divider 516 and a PLL 510. The PLL 510 may comprise a phase detector 506, a loop filter 508, a VCO 512 and a divider 514. There is also shown a DDFS control signal d(t), a reference clock compensation signal c(t), a DDFS output signal $s_D(t)$, a feedback signal $s_F(t)$, and an output signal $s_C(t)$.

An exemplary embodiment of the invention illustrated in FIG. 5 may be similar to the embodiment illustrated in FIG. 4. In particular, the PLL 410 may be functionally similar to the PLL 410 shown in FIG. 4. The DDFS 504 may be clocked by $s_C(t)$ instead of a separate reference oscillator 416 as shown in FIG. 4. In some implementations of the DDFS 504, the clocking signal may be fixed-frequency. If the DDFS 504 is clocked by $s_C(t)$, which may be a variable-frequency signal, an additional correction signal to compensate for the variable reference oscillating signal at the DDFS 504 may need to be generated, the reference clock compensation signal c(t). The reference clock compensation signal c(t) may be generated in the frequency control 502 and may be adjusted in function of the signal fed back to the frequency control 502 from the VCO 512 output. The reference clock compensation signal c(t) may be added to the DDFS control signal d(t) and may compensate the DDFS 504 for variation in frequency that may occur in $s_C(t)$, since $s_C(t)$ may clock the DDFS 504. The embodiment of the invention illustrated in FIG. 5 may use only the VCO 512 oscillator and may not need a separate clock to drive the DDFS 504.

In accordance with an embodiment of the invention, a method and system for a high-precision frequency generator using a direct digital frequency synthesizer for transmitters and receivers may include generating a second signal from a first signal by: frequency translating in multiplier 204 an inphase component of the first signal utilizing a high-precision oscillating signal $s_C(t)$ that may be generated using at least a direct digital frequency synthesizer (DDFS) 404/504 and at least a Phase-Locked Loop (PLL) 410/510, as shown in FIG. 2, FIG. 4 and FIG. 5. The invention may comprise frequency translating in multiplier 208, a corresponding quadrature component of the first signal utilizing a phase-shifted version of the high-precision oscillating signal. The inphase component of the first signal may be multiplied by the multiplier 204 with the high-precision oscillating signal $s_C(t)$ and the quadrature component of the first signal may be multiplied by the multiplier 208 with the phase-shifted version of the high-precision oscillating signal.

The second signal may be generated from the first signal by adding using adder 212, the frequency translated inphase component to the frequency translated quadrature component. A Phase-Locked Loop (PLL) 410/510 that may be communicatively coupled to and controlled by at least a DDFS 404/410 may generate the high-precision oscillating signal $s_C(t)$. A PLL 410/510 may comprise at least a fixed-factor frequency divider 414/514. A fixed-frequency reference oscillating signal from oscillator 416 or the high-precision oscillating signal $s_C(t)$ may be used to clock the DDFS 404 or 504, respectively. In instances where the high-precision oscillating signal $s_C(t)$ may be used to clock the DDFS 504, a clock compensation signal c(t) may be generated in a frequency control block 502 from a frequency divided version of the high-precision oscillating signal.

Another embodiment of the invention may provide a machine-readable storage, having stored thereon, a computer program having at least one code section executable by a machine, thereby causing the machine to perform the steps as described above for a method and system for a high-precision frequency generator using a direct digital frequency synthesizer for transmitters and receivers.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing communication signals, the method comprising:
    generating a second signal from a first signal by:
        frequency translating an inphase component of said first signal utilizing a high-precision oscillating signal generated using at least a direct digital frequency synthesizer (DDFS) and at least a Phase-Locked Loop (PLL);
        frequency translating a corresponding quadrature component of said first signal utilizing a phase-shifted version of said high-precision oscillating signal;
        clocking said DDFS by said high-precision oscillating signal; and
        controlling said DDFS using at least a reference clock compensation signal generated in a frequency control module, based on said high-precision oscillating signal.

2. The method according to claim 1, comprising multiplying said inphase component of said first signal with said high-precision oscillating signal.

3. The method according to claim 1, comprising multiplying said quadrature component of said first signal with said phase-shifted version of said high-precision oscillating signal.

4. The method according to claim 1, comprising generating said second signal from said first signal by adding said frequency translated inphase component to said frequency translated quadrature component.

5. The method according to claim 1, comprising generating said high-precision oscillating signal in said at least said Phase-Locked Loop (PLL) that is communicatively coupled to and controlled by said at least said Direct Digital Frequency Synthesizer (DDFS).

6. The method according to claim 1, wherein said at least said Phase-Locked Loop (PLL) comprises at least a fixed-factor frequency divider.

7. The method according to claim 1, comprising clocking said at least said Direct Digital Frequency Synthesizer (DDFS) by a fixed-frequency reference oscillating signal.

8. The method according to claim 1, comprising generating said clock compensation signal from a frequency-divided version of said high-precision oscillating signal.

9. A system for processing communication signals, the system comprising:
    one or more circuits that generate a second signal from a first signal;
        said one or more circuits comprising at least a direct digital frequency synthesizer (DDFS) and at least a Phase-Locked Loop (PLL);
        said one or more circuits frequency translate an inphase component of said first signal utilizing a high-precision oscillating signal generated using said at least said direct digital frequency synthesizer (DDFS) and said at least said Phase-Locked Loop (PLL);
        said one or more circuits frequency translate a corresponding quadrature component of said first signal utilizing a phase-shifted version of said generated high-precision oscillating signal;
        said one or more circuits clock said DDFS by said high-precision oscillating signal; and
        said one or more circuits control said DDFS using at least a reference clock compensation signal generated in a frequency control module, based on said high-precision oscillating signal.

10. The system according to claim 9, wherein said one or more circuits multiply said inphase component of said first signal with said high-precision oscillating signal.

11. The system according to claim 9, wherein said one or more circuits multiply said quadrature component of said first signal with said phase-shifted version of said high-precision oscillating signal.

12. The system according to claim 9, wherein said one or more circuits generate said second signal from said first signal by adding said frequency translated inphase component to said frequency translated quadrature component.

13. The system according to claim 9, wherein said one or more circuits generate said high-precision oscillating signal in said at least said Phase-Locked Loop (PLL) that is communicatively coupled to and controlled by said at least said Direct Digital Frequency Synthesizer (DDFS).

14. The system according to claim 9, wherein said at least said Phase-Locked Loop (PLL) comprises at least a fixed-factor frequency divider.

15. The system according to claim 9, wherein said one or more circuits clock said at least said Direct Digital Frequency Synthesizer (DDFS) by a fixed-frequency reference oscillating signal.

16. The system according to claim 9, wherein said one or more circuits generate said clock compensation signal from a frequency-divided version of said high-precision oscillating signal.

* * * * *